(12) United States Patent
Mazza et al.

(10) Patent No.: US 12,568,684 B2
(45) Date of Patent: \*Mar. 3, 2026

(54) INTEGRATED CIRCUIT STRUCTURE WITH CELLS HAVING ASYMMETRIC POWER RAIL

(71) Applicant: GlobalFoundries U.S. Inc., Malta, NY (US)

(72) Inventors: James P. Mazza, Saratoga Springs, NY (US); Xuelian Zhu, Sunnyvale, CA (US); Jia Zeng, Sunnyvale, CA (US); Navneet Jain, Milpitas, CA (US); Mahbub Rashed, Cupertino, CA (US)

(73) Assignee: GlobalFoundries U.S. Inc., Malta, NY (US)

( \* ) Notice: Subject to any disclaimer, the term of this patent is extended or adjusted under 35 U.S.C. 154(b) by 901 days.

This patent is subject to a terminal disclaimer.

(21) Appl. No.: 17/812,790

(22) Filed: Jul. 15, 2022

(65) Prior Publication Data

US 2024/0021621 A1     Jan. 18, 2024

(51) Int. Cl.
H10D 84/90 (2025.01)
H10D 89/10 (2025.01)

(52) U.S. Cl.
CPC ........... H10D 84/907 (2025.01); H10D 89/10 (2025.01); *H10D 84/975* (2025.01); *H10D 84/981* (2025.01)

(58) Field of Classification Search
CPC ...... H10D 84/40; H10D 84/401; H10D 84/90; H10D 84/907; H10D 84/975; H10D 84/981; H10D 88/00; H10D 89/10
See application file for complete search history.

(56) References Cited

U.S. PATENT DOCUMENTS

| | | |
|---|---|---|
| 8,698,205 B2 | 4/2014 | Tzeng et al. |
| 10,236,302 B2 | 3/2019 | Correale, Jr. et al. |

(Continued)

FOREIGN PATENT DOCUMENTS

WO      WO-2012118668 A1 \* 9/2012 ........... G06F 30/394

OTHER PUBLICATIONS

Chava et al., "DTCO exploration for efficient standard cell power rails," Proceedings of SPIE, Proc. SPIE 10588, Design-Process-Technology Co-optimization for Manufacturability XII, 105880B, Mar. 20, 2018, 8 pages.

*Primary Examiner* — Brook Kebede
(74) *Attorney, Agent, or Firm* — David Cain; Hoffman Warnick LLC

(57)          ABSTRACT

An integrated circuit (IC) structure includes a plurality of cell rows with each cell row including a plurality of (standard) cells. A power rail for at least one pair of adjacent cell rows is asymmetric relative to a cell boundary between adjacent cells of the at least one pair of adjacent cell rows. Embodiments of the disclosure can also include the standard cell including a plurality of transistors at a device layer, and at least a portion of an isolation area at an edge of the device layer defining a cell boundary. The standard cell also includes the power rail including a first portion within the cell boundary and a second portion outside the cell boundary. The first portion and the second portion have different heights such that the power rail is asymmetric across the cell boundary. The asymmetric power rail provides seamless integration of cell libraries having different heights.

19 Claims, 7 Drawing Sheets

(56) References Cited

U.S. PATENT DOCUMENTS

| | | | |
|---|---|---|---|
| 2019/0164949 A1 | 5/2019 | Sio et al. | |
| 2020/0050728 A1* | 2/2020 | Kim | G06F 30/392 |
| 2022/0114320 A1 | 4/2022 | Yu et al. | |

* cited by examiner

INTEGRATED CIRCUIT STRUCTURE WITH CELLS HAVING ASYMMETRIC POWER RAIL

BACKGROUND

The present disclosure relates to integrated circuit structures, and more specifically, to an integrated circuit structure including standard cells having an asymmetric power rail.

A standard cell, or simply cell, is a group of transistors and related interconnect elements that provide a given Boolean logic function (e.g., OR, AND, XNOR, XOR, etc.) or a storage function (latch or flipflop). Cells can be coupled together to design application specific IC structures. The desired cells are selected from a cell library and are mapped into cell rows in a grid. Once mapped out, the structural design is converted into a physical layout.

Cells within a given library have a common dimension in a direction of polyconductor gates (Y-direction), which is referred to as a 'height' of the cell. Different libraries have cells having different heights. Typically, like sized cells from a given library are placed in the same row in the grid and are vertically adjacent to cell rows with cells having the same height. Cells with different cell heights are placed in physically separate standard cells. The different cells of adjacent rows mate at cell boundaries. The cells of adjacent rows may also have a power rail at a selected metal layer of the design that is placed straddling the cell boundary such the power rail structure is shared between two adjacent cell rows with half portions in each cell. The power rail is a conductive line supplying electric power ($V_{dd}$ or ground) to the parts of the cells through other interconnect layers of the IC structure. In order for the cells to be easily placed in the grid, power rails are all sized the same regardless of library and cell height so that adjacent cell rows are design rule clean. Consequently, the resulting power rails have symmetric power rail structures across cell boundaries of adjacent cells. The common sizing of the symmetric power rail across all libraries presents challenges for continued scaling of IC structures. For example, design rule violations can occur at placement, requiring re-design of the IC structure. Where power rails are sized for the largest cells, the smaller cells can experience congestion issues. Similarly, where power rails are sized for the smallest cells, the larger cells can experience electromigration/voltage drop (EM/IR) issues, and related performance issues.

SUMMARY

An aspect of the disclosure related to an integrated circuit (IC) structure, comprising: a first cell row extending in a first direction and including a plurality of first cells disposed therein, each first cell having a first cell height and a first portion of a first shared power rail having a first inside rail height; and a second cell row extending in the first direction and immediately adjacent the first cell row, the second cell row including a plurality of second cells disposed therein, each second cell having a second cell height and a second portion of the first shared power rail having a second rail height different than the first rail height, wherein the first portion and the second portion of the first shared power rail are disposed in an asymmetric manner across a cell boundary between the first cell row and the second cell row.

Another aspect of the disclosure includes an integrated circuit (IC) structure, comprising: a plurality of cell rows, each cell row including a plurality of cells, wherein adjacent cell rows share a power rail in a metal layer, wherein the power rail of at least one pair of adjacent cell rows is asymmetric relative to a cell boundary between adjacent cells of the at least one pair of adjacent cell rows.

Another aspect of the disclosure is directed to a standard cell for an integrated circuit (IC) structure, the standard cell comprising: a plurality of transistors at a device layer; at least a portion of an isolation area at an edge of the device layer defining a cell boundary; and a power rail in a metal layer, the power rail including a first portion within the cell boundary and a second portion outside the cell boundary, wherein the first portion and the second portion have different heights such that the power rail is asymmetric across the cell boundary.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
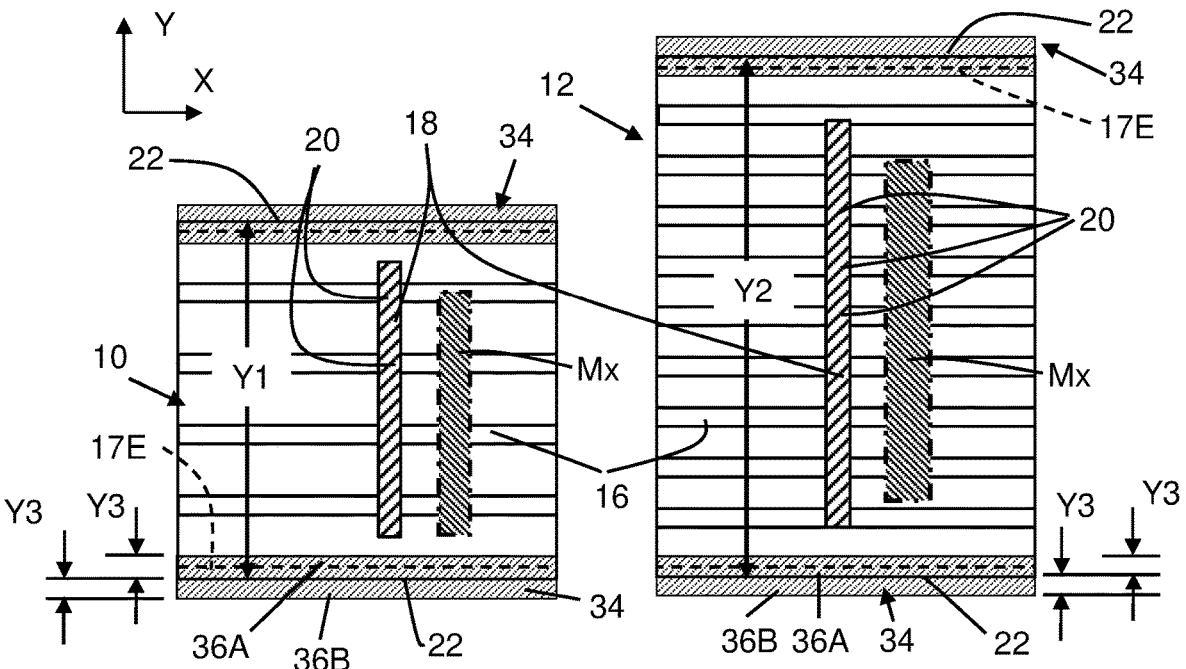
FIG. 1 shows a schematic top-down view of a device layer of a pair of prior art standard cells.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include an integrated circuit (IC) structure including a plurality of cell rows with each cell row including a plurality of (standard) cells. Adjacent cell rows share a power rail in at least one metal layer. The power rail for at least one pair of adjacent cell rows is asymmetric relative to a cell boundary between adjacent cells of the at least one pair of adjacent cell rows. Embodiments of the disclosure can also include the standard cell including a plurality of transistors at a device layer, and at least a portion of an isolation area at an edge of the device layer defining a cell boundary. The standard cell also includes the power rail in a metal layer. The power rail includes a first portion within the cell boundary and a second portion outside the cell boundary, where the first and second portions have different heights such that the power rail is asymmetric across the cell boundary. The standard cells and IC structures with the asymmetric power rail reduce demand for area and improve performance and power using standard cells with multiple cell heights. The asymmetric power rail also allows for seamless integration of multiple libraries having different heights while avoiding design rule violations, crowding and/or electromigration/voltage drop (EM/IR) issues.

Figure 2:
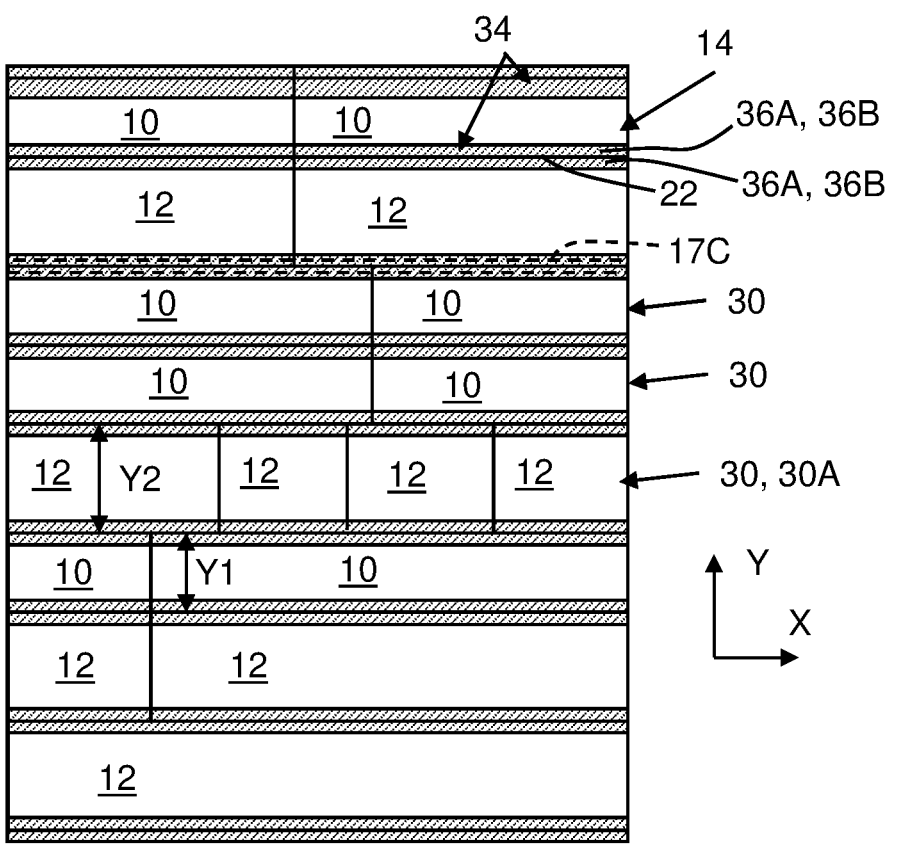
FIG. 2 shows a schematic top-down view of a prior art IC structure including a plurality of standard cells.

FIG. 1 shows a schematic top-down view of a device layer of a pair of prior art standard cells 10, 12 having heights Y1 and Y2 (Y1<Y2), respectively; and FIG. 2 shows a schematic top-down view of a prior art IC structure 14 including a plurality of standard cells 10, 12. A "standard cell", or simply "cell", is a group of transistors 20 and related interconnect elements that provide a given Boolean logic function (e.g., OR, AND, XNOR, XOR, etc.) or a storage function (latch or flipflop). As shown in FIG. 2, cells 10, 12 can be coupled together to design application specific IC structures 14. FIG. 1 shows active regions 16, such as semiconductor fins, extending in the X-direction or width direction of cells 10, 12. In a planar design, the active regions 16 would be larger rectangular elements encompassing the area of multiple fins. Polyconductor gates 18 (only one shown for clarity) extend over any number active regions 16 to form a plurality of transistors 20. Other structures of transistors 20 are not shown for clarity, e.g., source/drain regions, contacts, diffusion breaks, gate cuts, etc.

Each cell 10, 12 as a height, e.g., Y1, Y2, respectively. As used herein, "height" or "cell height" indicates a dimension of the cell in a Y-direction (see legend) that is parallel to a direction of polyconductor gates 18 and extends from cell boundary 22 to cell boundary 22. Height can also be stated as "track height." "Track" means the minimum pitch of the lowest routing metal layer, e.g., a second metal layer (M2). Track height can be stated in terms of a multiples of the track, e.g., a 6 track cell has a height 6 times the minimum pitch of the lowest routing metal layer. Generally speaking, cells 10 having a smaller height, e.g., Y1, are denser in terms of circuitry therein, have less routing space available (smaller area), and are typically lower performance, lower power. Cells 12 with a larger height typically have less dense circuitry, more routing options (larger area), and have higher power and performance.

A "cell boundary" 22 is an edge of a cell 10, 12 where electrical isolation between two rows of cells exists, and where the cells abut vertically or horizontally. As shown in FIG. 2, cells 10, 12 meet at a boundary, so when cells 10, 12 are joined, a common isolation area 17C (below power rail 34 (only one shown)) is formed by the adjacent cells. As shown in FIG. 2, cells 10, 12 may be selected from "libraries" of cells having the same height, so they can be arranged in a grid together in rows 30 of common height cells. See, for example, row 30A in FIG. 2 with cells 12 of common height Y2.

As shown by patterned hatching over cell boundaries 22, a power rail 34 is also defined relative to cell boundary 22 in each cell 10, 12. The power rail is a conductive line supplying electric power ($V_{dd}$ or ground) to the parts of cells 10, 12 through other interconnect layers of IC structure 14. Power rail 34 can be at any common metal layer within cells 10, 12, e.g., middle of line metals, first metal layer M1, and/or higher. As shown in FIGS. 1 and 2, conventionally, power rail 34 is defined to have half portions 36A, 36B straddling across cell boundary 22. It will be recognized that while half portions 36A, 36B are both part of a design of any cell 10, 12, half portion 36B shown outside cell boundary 22 is that portion of power rail 34 formed once for two respective cells 10, 12. Half portions 36B shown outside cell boundary 22 are part of the design of the cell and schematically overlap in adjacent cells 10, 12, but are only formed once. As shown in FIG. 2, when cells 10, 12 are joined, the power rail half portions 36A, 36B collectively form power rail 34 between adjacent cells 10 or 12 in a lengthwise symmetrical manner across mating cell boundaries 22 of adjacent cells 10, 12.

In order for cells 10, 12 to be easily placed in the grid shown in FIG. 2, the mating half portions 36A, 36B for power rails 34 are all sized the same regardless of library and/or cell height. For example, each half portion 36A, 36B has height Y3 (FIG. 1). Consequently, the resulting power rails 34 have symmetric power rail half portions 36A, 36B across mating cell boundaries 22 of adjacent cells 10, 12. As noted, the common sizing of the power rail half portions across all libraries presents challenges for continued scaling of IC structures. For example, design rule violations can occur at placement, requiring re-design of the IC structure. Where power rail half portions 36A, 36B are sized for the larger cells 12, the smaller cells 10 can experience congestion issues, e.g., with power rail 34 too close to metal wiring in the same metal layer Mx (only one example shown in FIG. 1 for each cell 10, 12). Where power rail half portions 36A, 36B are sized for the smaller cells 10, the larger cells 12 can experience electromigration/voltage drop (EM/IR) issues, and related performance issues.

Figure 3:
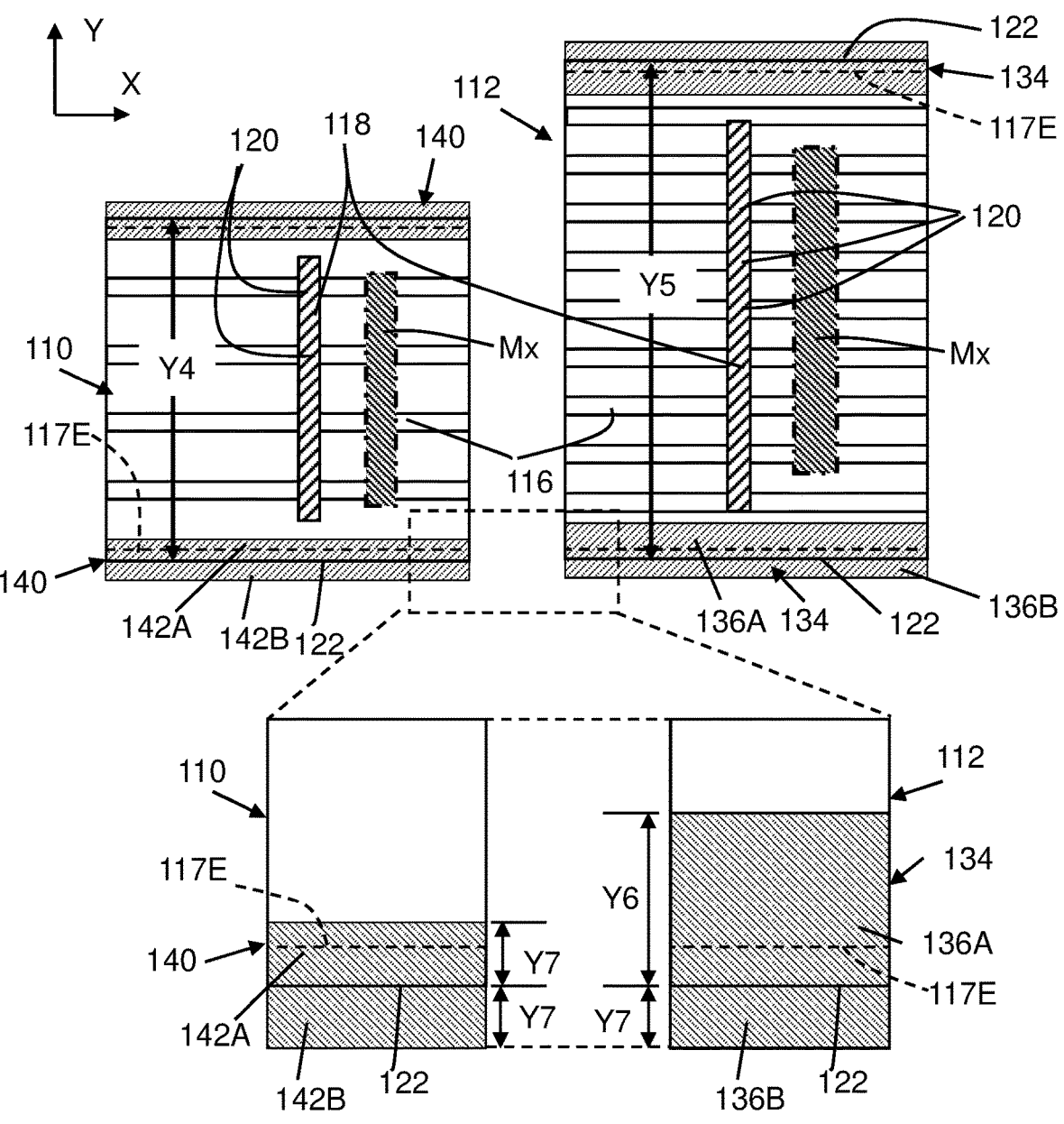
FIG. 3 shows a schematic top-down view of a device layer of a pair of standard cells having different cell heights, and with an enlarged area showing different portions of an asymmetric power rail, according to embodiments of the disclosure.
Figure 4:
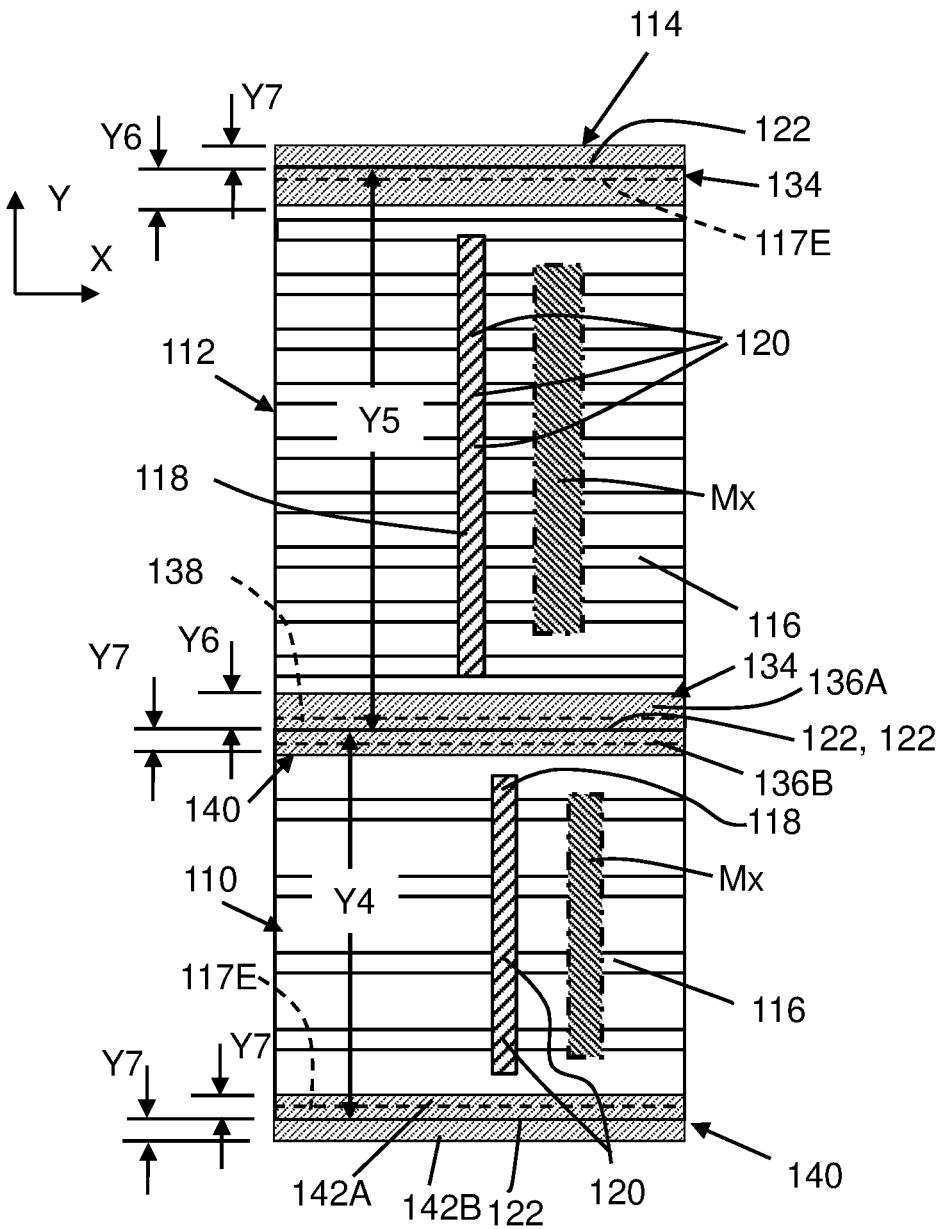
FIG. 4 shows a schematic top-down view of an illustrative pair of standard cells coupled together to form an asymmetric power rail, according to embodiments of the disclosure.

FIG. 3 shows a schematic top-down view of a device layer of a pair of standard cells 110, 112 having different heights Y4 and Y5 (Y4<Y5), respectively. (Heights of cells 110, 112 may be sometimes referred to herein as "cell height" to distinguish between "rail height" of a power rail 134, 140 or portions thereof). An enlarged area in FIG. 3 shows different height rail portions 136A, 136B of an asymmetric power rail 134. More specifically, FIG. 3 shows a rail portion 136A with rail height Y6, and rail portion 136B with rail height Y7, where Y6≠Y7. As will be described further, FIG. 4 shows a schematic top-down view of an illustrative pair of standard cells 110, 112 coupled together, according to embodiments of the disclosure.

Figure 6:
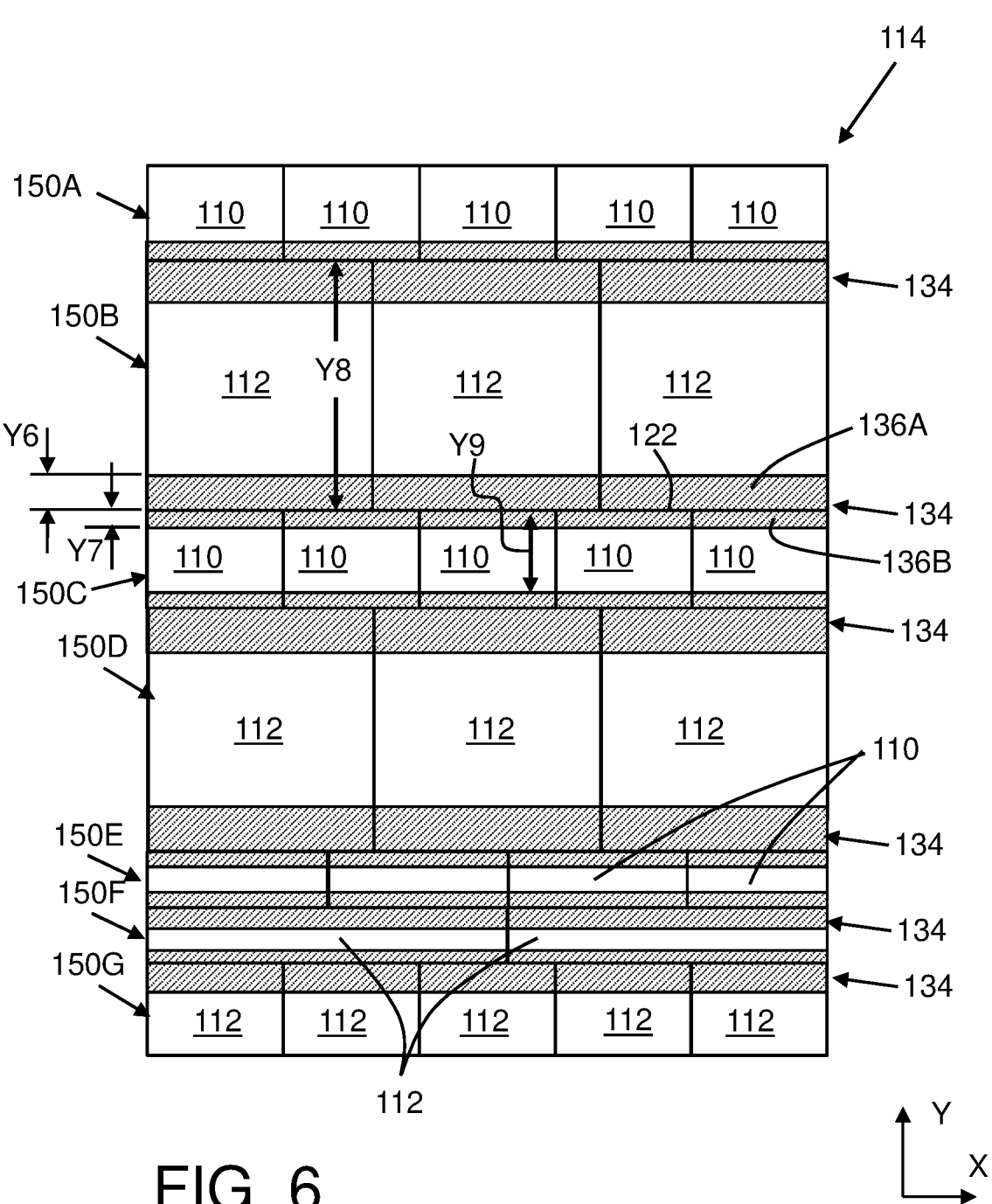
FIG. 6 shows a schematic top-down view of an IC structure including a plurality of standard cells having different cell heights with a shared asymmetric power rail, according to embodiments of the disclosure.
Figure 7:
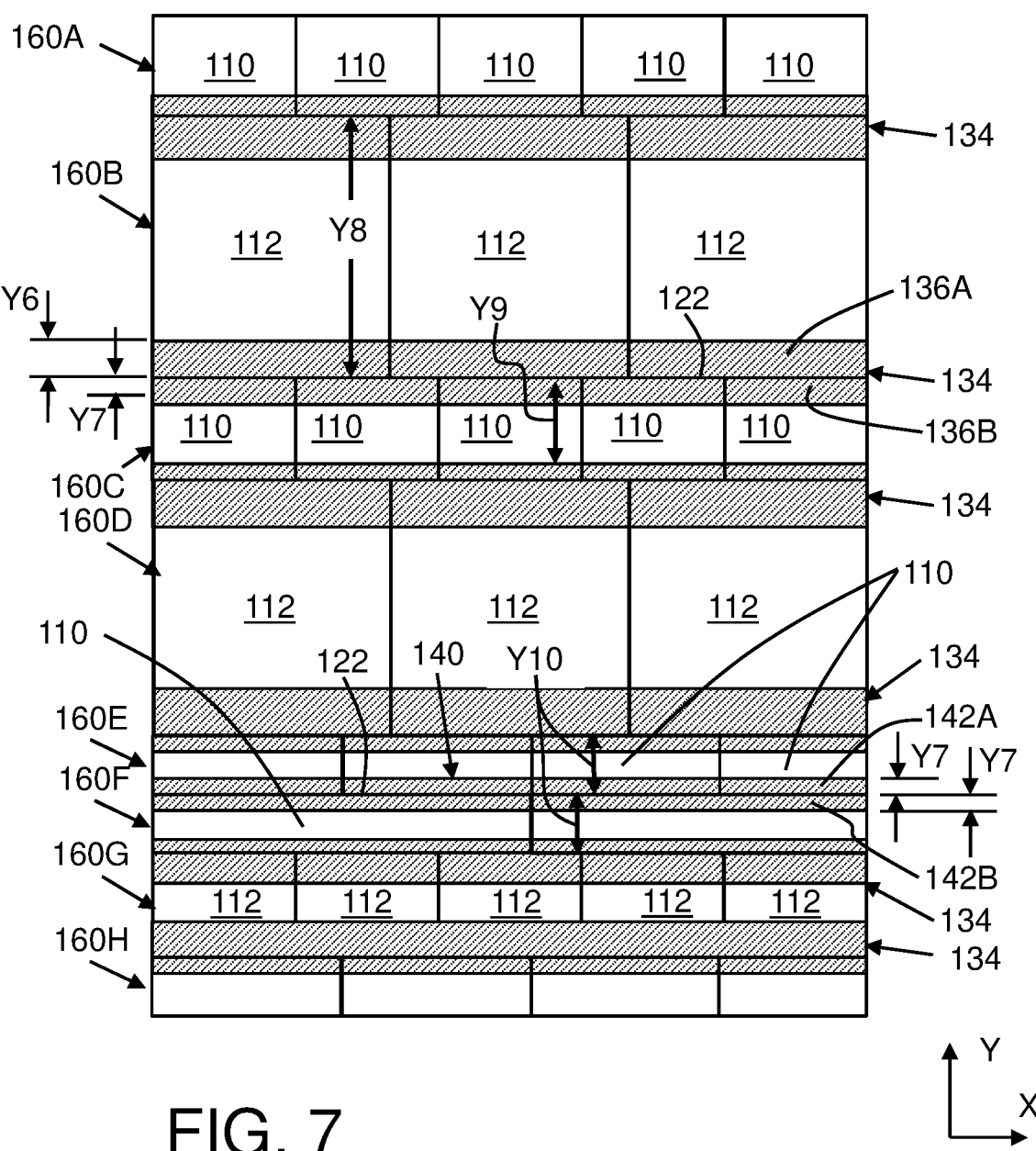
FIG. 7 shows a schematic top-down view of an IC structure including a plurality of standard cells having different cell heights with a shared asymmetric power rail and a shared symmetric power rail, according to other embodiments of the disclosure.

FIG. 3 shows standard cells 110, 112 for an IC structure 114 (FIGS. 6-7). Standard cells 110, 112 (hereafter simply "cells") include a plurality of transistors 120 at a device layer. Transistors 120 can include any now known or later developed transistor structure. In the example shown, active regions 116 are in the form of semiconductor fins, but other active regions are also possible. Polyconductor gates 118 (only one shown for clarity) extend over any number of active regions 116 to form a plurality of transistors 120. Other structures of transistors 120 are not shown for clarity, e.g., source/drain regions, contacts, diffusion breaks, gate cuts, etc. In any event, standard cells 110, 112 include at least a portion of an isolation area 117E at an edge of the device layer defining a cell boundary 122 (fins at a cell boundary are not preserved). As shown in FIG. 4, isolation area 117E mates with a similar isolation area 117E in an adjacent cell to form a complete isolation region 138 (dashed box in FIG. 4). Each cell 110, 112 includes a group of transistors 20 and related interconnect elements that provide a given Boolean logic function (e.g., OR, AND, XNOR, XOR, etc.) or a storage function (latch or flipflop). Other structures of transistors 120 are not shown for clarity, e.g., source/drain regions, contacts, diffusion breaks, gate cuts, etc. As shown in FIG. 4, cells 110, 112 can be coupled together to provide application specific IC structures 114.

In the example shown, standard cell 110 may include a symmetric power rail 140. As shown in the enlarged area in FIG. 3, for cell 110, a first portion 142A and a second portion 142B are half portions of power rail 140, i.e., with same height Y7. Hence, power rail 140 is symmetric relative to cell boundary 122 in cell 110 when combined with an adjacent cell of the same cell height Y4. In contrast, cell 112 includes an asymmetric power rail 134 in a metal layer Mx, according to embodiments of the disclosure. Power rail 134 in cell 112 includes a first portion 136A within cell boundary 122 and a second portion 136B outside cell boundary 122, respectively. It will be recognized that while portions 136A, 136B, 142A, 142B are part of a design of a respective cell 112, 110, first portion 136A, 142A shown inside cell boundary 122 is that portion of power rail 134, 140 formed as part of that respective cell 112, 110. Second portions 136B, 142B are part of the design and schematically overlap in adjacent cells 110, 112, but are only formed once.

As shown in the enlarged area in FIG. 3, in contrast to cell 110, power rail 134 for cell 112 has first portion 136A and second portion 136B having different rail heights Y6, Y7, respectively, such that power rail 134 is asymmetric across cell boundary 122. (As noted, height of power rails or portions thereof are sometimes referred to herein as "rail height" to distinguish from a height of a cell, i.e., "cell height"). In the example shown, rail height Y6 of first portion 136A is larger than rail height Y7 of second portion 136B of power rail 134 in cell 112. The difference between rail heights Y6, Y7 can be user defined depending on a large number of factors such as but not limited to: the desired power rail 134 overall height, power usage, performance desired, and/or available area (space). Rail height Y7 of second portion 136B can have dimensions selected to mate with whatever rail height is used outside rail portion 142B for symmetric power rails 134 in cells 110, e.g., minimum pitch of the lowest routing metal layer. Power rails 134, 140 may be located in a lowest routing metal layer Mx, i.e., in which metal wires run laterally in a non-linear fashion. However, other metal layers are also possible, e.g., a first metal layer M1.

Figure 5:
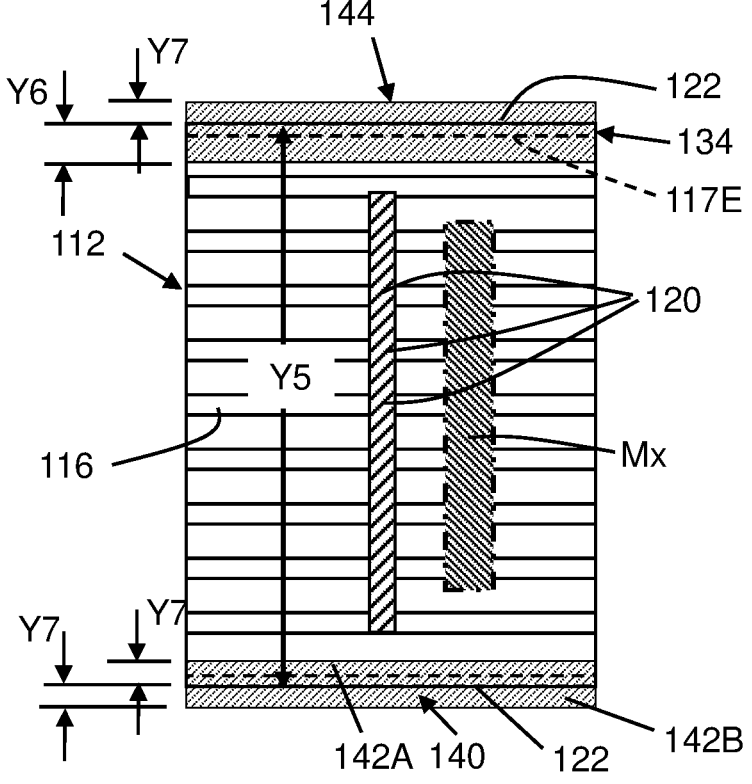
FIG. 5 shows a schematic top-down view of a device layer of a cell according to an alternative embodiment.

Although not necessary in all cases, in the example shown in FIG. 3, cell 110 includes a symmetric power rail 140 at both cell boundaries 122 thereof. Similarly, cell 112 includes an asymmetric power rail 134 at both cell boundaries 122 thereof. However, symmetric power rails 140 and asymmetric power rail 134 can both be used on the same cell. FIG. 5 shows a schematic top-down view of a device layer of an illustrative cell 144 according to an alternative embodiment. In this case, cell 144 has an asymmetric power rail 134 at one cell boundary 122 (top as shown) and a symmetric power rail 140 on the other cell boundary 122 (bottom as shown).

FIG. 6 shows a schematic top-down view of an IC structure 114 including a plurality of cells 110, 112 having different cell heights, according to embodiments of the disclosure. FIG. 7 shows a schematic top-down view of an IC structure 114 including a plurality of cells 110, 112 having different cell heights, according to other embodiments of the disclosure.

As shown in FIGS. 6-7, IC structure 114 may include a plurality of cells 110, 112 arranged in a grid with a number of rows 150A-G, 160A-H, respectively. That is, IC structure 114 may include a plurality of cell rows 150A-G, 160A-H, where each cell row includes a plurality of cells 110, 112. Any number of cell rows 150, 160 may be used, each row with any number of cells 110, 112 therein. In the non-limiting examples of FIGS. 6 and 7, seven cell rows 150A-G are shown in FIG. 6, and eight cell rows 160A-H are shown in FIG. 7. IC structure 114 may include any number of cells 110, 112 in any arrangement of cell rows 150, 160. Adjacent cell rows 150A-G, 160A-H share a power rail 134 or 140 in a metal layer. Cells 110, 112 may be selected for their given functions, and arranged to create any form of application specific IC structure.

The power rail of at least one pair of adjacent cell rows 150A-G, 160A-H is asymmetric relative to cell boundary 122 between adjacent cells of the at least one pair of adjacent cell rows. Cells 110, 112 can be part of any number of libraries of identical cell height, i.e., cell rows 150A-G, 160A-H within IC structure 114 can have two or more different cell heights (three shown in FIGS. 6-7). For example, cells in a first row (e.g., 150B) of the at least one pair of adjacent cell rows (e.g., 150B-C) may have a first cell height Y8, and cells 110 in a second row (e.g., 150C) of the at least one pair of adjacent cell rows (e.g., 150B-C) may have a second cell height Y9. First cell height Y8 is different than second cell height Y9, e.g., Y8>Y9. While cells 110, 112 are shown with similar widths (sideways on page) within a cell row 150A-G, 160A-H, it will be recognized that cell widths may vary within a cell row. In addition, while a particular plurality of cell rows 150 (e.g., seven cell rows 150A-G in FIG. 6, eight cell rows 160A-H in FIG. 7) is illustrated for each IC structure 114, any number of cell rows 150, 160 may be present.

In FIG. 6, for example, cells 112 in first row 150B of the at least one pair of adjacent cell rows (e.g., 150B-C) include first (inside) portion 136A of power rail 134 having first rail height Y6, and cells in a second row 150C of the at least one pair of adjacent cell rows includes second (outside) portion 136B of power rail 134 having a second rail height Y7, which is different than first rail height Y6. In this manner, first and second rail heights Y6, Y7 create the asymmetry of power rail 134 relative to cell boundary 122 between adjacent cells of pair(s) of adjacent cell rows 150B-C.

In many cases, the larger power rail 134 is advantageous for larger cells, like cells 112, and the larger portion of the power rail 134 can be more readily accommodated by the larger cell 112. Hence, although not necessary in all cases, where first cell height Y8 is larger than second cell height Y9, first rail height Y6 may be larger than second rail height Y7. That is, the larger portion of asymmetric power rail 134 is in cell 112 with the larger cell height Y8. Similarly, where cell height Y9 of a cell 110 is smaller than cell height Y8 of another cell 112, the corresponding rail height Y7 of the portion of power rail 134 for the smaller cell 110 is smaller than rail height Y6 for the larger cell 112. That is, the smaller portion of asymmetric power rail 134 is in cell 110 with the smaller cell height Y9.

In FIG. 6, asymmetric power rails 134 are present between each pair of cell rows 150A-G. That is, power rail 134 of each pair of adjacent cell rows is asymmetric relative to cell boundary 122 between the adjacent cells thereof. Hence, each pair of adjacent cell rows 150A-G includes an arrangement of cells 110, 112 that forms power rail 134 that is asymmetric relative to cell boundary 122 between the adjacent cells thereof. In some cases, cells 112 may include asymmetric power rail 134 on both cell boundaries 122 (as in FIG. 3), and in other cases, cells 112 may include asymmetric power rail 134 on only on one cell boundary 122 (as in FIG. 5). In the latter case, an asymmetric power rail 134 may be formed by the opposing cell boundary 122 of the respective cell. See, for example, cells 110 in cell row 150E in FIG. 6.

As shown in FIG. 7, in other embodiments, asymmetric power rails 134 and symmetric power rails 140 (between rows 160E-F) can be used in the same IC structure 114. That is, IC structure 114 also includes power rail 140 for at least one other pair of adjacent cell rows 160E-F that is symmetric relative to cell boundary 122 between adjacent cells 110, 112 of the pair of adjacent cell rows 160E-F.

Cell 112 may be formed to couple with other similar (larger) cells 112, or they may be formed to couple with (smaller) cells 110 having a symmetric power rail 140. Symmetric power rail 140 for cell 110 may include mating half portions 142A, 142B that are all sized the same regardless of library and/or cell height Y4 (FIGS. 3-4). For example, as shown in FIGS. 3 and 4, each half portion 142A, 142B may have the same height Y7. Consequently, as shown in FIG. 7, where cells 110 are mated with other cells 110, the resulting power rail 140 is symmetric across mating cell boundaries 122 of the adjacent cells 110.

In another embodiment, as shown in FIGS. 6-7, IC structure 114 includes a first cell row (e.g., 150B, 150D, 150F-G; or 160B, 160D, 160F-H) extending in a first direction (e.g., X direction) and including a plurality of cells 112 disposed therein. Each cell 112 has a cell height (e.g., Y8 for row 150B, 160B) and a first (inside) portion 136A of shared asymmetric power rail 134 having an inside rail height Y6. Inside rail height Y6 is that part of power rail 134, 140 denoted as within cell boundary 122, and eventually formed as part of the respective cell 110, 112. IC structure 114 also includes a second cell row (e.g., 150A, 150C, 150E; or 160A, 160C, 160E, 160F) extending in the first direction and immediately adjacent first cell row (e.g., 150B, 150D, 150F-G; and 160B, 160D, 160F-H, respectively). The second cell row(s) include a plurality of second cells 110 disposed therein. Each second cell 110 has a second cell height Y9 (see, e.g., cells in rows 150C, 160C). First and second portions 136A, 136B of shared power rail 134 are disposed in an asymmetric manner across cell boundary 122 between first cell row 150B and second cell row 150C. Cell heights Y8, Y9 can also be different, e.g., Y8>Y9. In many cases, the larger asymmetric power rail 134 is advantageous for larger cells, like cells 112, and the larger portion of the power rail 134 can be more readily accommodated by the larger cell 112. Hence, although not necessary in all cases, where first cell height Y8 is larger than second cell height Y9, first rail height Y6 may be larger than second rail height Y7. That is, the larger portion of asymmetric power rail 134 is in cell 112 with the larger cell height Y8. Similarly, where cell height Y9 of a cell 110 is smaller than cell height Y8 of another cell 112, the corresponding rail height Y7 of the portion of power rail 134 for the smaller cell 110 is smaller than rail height Y6 for the larger cell 112. Hence, the smaller portion of asymmetric power rail 134 is in cell 110 with the smaller cell height Y9.

As shown in FIG. 7, IC structure 114 may also include pair(s) of adjacent cell rows that share a symmetric power rail 140. For example, IC structure 114 may include a cell row 160E extending in the X direction and including a plurality of cells 110 disposed therein. Each cell 110 may have a cell height Y10 and a first portion 142A of symmetric (second) shared power rail 140 having rail height Y7. IC structure 114 may also include a cell row 160F extending in the X direction and immediately adjacent cell row 160E. Cell row 160F also includes a plurality of cells 110 disposed therein, where each cell 110 therein has cell height Y10 and a second portion 142B of shared symmetric power rail 140 having rail height Y7, i.e., same rail height as row 160E. First and second portions 142A, 142B of shared power rail 140 are disposed in a symmetric manner across cell boundary 122 between cell row 160E and cell row 160F.

IC structures 114 may be formed using cells 110, 112, 144 described herein using any now known or later developed semiconductor fabrication processes. Power rails 134, 140 may be formed in any metal layer Mx.

Embodiments of the disclosure provide various technical and commercial advantages, examples of which are discussed herein. The standard cells and IC structures using the asymmetric power rails, as described herein, occupy less surface area and improve performance and power using standard cells with multiple cell heights. The asymmetric power rail also allows for seamless integration of multiple libraries having different cell heights while avoiding design rule violations, crowding and/or electromigration/voltage drop (EM/IR) issues.

The standard cells and IC structure as described herein are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present-disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   a first cell row extending in a first direction and including a plurality of first cells disposed therein, each first cell having a first cell height and a first portion of a first shared power rail having a first rail height; and
   a second cell row extending in the first direction and immediately adjacent the first cell row, the second cell row including a plurality of second cells disposed therein, each second cell having a second cell height and a second portion of the first shared power rail having a second rail height different than the first rail height,
   wherein the first portion and the second portion of the first shared power rail are disposed in an asymmetric manner across a cell boundary between the first cell row and the second cell row.

2. The IC structure of claim 1, wherein the first cell height is different than the second cell height.

3. The IC structure of claim 2, wherein where the first cell height is larger than the second cell height, the first inside rail height is larger than the second inside rail height.

4. The IC structure of claim 2, wherein each first cell height is smaller than the second cell height, the first rail height is smaller than the second rail height.

5. The IC structure of claim 1, wherein the first shared power rail is located in a lowest routing metal layer.

6. The IC structure of claim 1, further comprising:
   a third cell row extending in the first direction and including a plurality of third cells disposed therein, each third cell having a third cell height and a first portion of a second shared power rail having a third rail height; and
   a fourth cell row extending in the first direction and immediately adjacent the third cell row, the fourth cell row including a plurality of fourth cells disposed therein, each fourth cell having the third cell height and a second portion of the second shared power rail having the third rail height,
   wherein the first portion and the second portion of the second shared power rail are disposed in a symmetric manner across a cell boundary between the third cell row and the fourth cell row.

7. The IC structure of claim 1, wherein each first cell and each second cell further includes:
   a plurality of transistors at a device layer; and
   at least a portion of an isolation area at an edge of the device layer defining the cell boundary.

8. An integrated circuit (IC) structure, comprising:
   a plurality of cell rows, each cell row including a plurality of cells, wherein adjacent cell rows share a power rail in a metal layer,
   wherein the power rail of at least one pair of adjacent cell rows is asymmetric relative to the cell boundary between adjacent cells of the first row and second row.

9. The IC structure of claim 8, wherein cells in a first row of the at least one pair of adjacent cell rows have a first cell height, and wherein cells in a second row of the at least one pair of adjacent cell rows have a second cell height, and wherein the first cell height is different than the second cell height.

10. The IC structure of claim 9, wherein cells in the first row of the at least one pair of adjacent cell rows include a first portion of the power rail having a first rail height, and wherein cells in a second row of the at least one pair of adjacent cell rows include a second portion of the power rail having a second rail height different than the first rail height, wherein the first rail height and the second rail height create the asymmetry of the power rail relative to the cell boundary between adjacent cells of the at least one pair of adjacent cell rows.

11. The IC structure of claim 10, wherein where the first cell height is larger than the second cell height, the first rail height is larger than the second rail height.

12. The IC structure of claim 10, wherein where the first cell height is smaller than the second cell height, the first rail height is smaller than the second rail height.

13. The IC structure of claim 8, wherein the metal layer includes a lowest routing metal layer.

14. The IC structure of claim 8, further comprising a power rail of at least one other pair of adjacent cell rows that is symmetric relative to a cell boundary between adjacent cells of the at least one other pair of adjacent cell rows.

15. The IC structure of claim 8, wherein the power rail of each pair of adjacent cell rows is asymmetric relative to the cell boundary between the adjacent cells thereof.

16. The IC structure of claim 8, wherein each cell further includes:

a plurality of transistors at a device layer; and at least a portion of an isolation area at an edge of the device layer defining the cell boundary.

17. A standard cell for an integrated circuit (IC) structure, the standard-cell comprising:

a plurality of transistors at a device layer;

at least a portion of an isolation area at an edge of the device layer defining a cell boundary; and a power rail in a metal layer, the power rail including a first portion within the cell boundary and a second portion outside the cell boundary, wherein the first portion and the second portion have different heights such that the power rail is asymmetric across the cell boundary.

18. The standard cell of claim 17, wherein the power rail is located in a lowest routing metal layer.

19. An integrated circuit (IC) structure including a plurality of the standard cells of claim 17.

* * * * *